United States Patent [19]
Robinson et al.

[11] 4,042,951
[45] Aug. 16, 1977

[54] GOLD-GERMANIUM ALLOY CONTACTS FOR A SEMICONDUCTOR DEVICE

[75] Inventors: John Thomas Robinson, Dallas; Richard A. Edwards, Richardson, both of Tex.

[73] Assignee: Texas Instruments Incorporated, Dallas, Tex.

[21] Appl. No.: 616,718

[22] Filed: Sept. 25, 1975

[51] Int. Cl.² ............... H01L 23/48; H01L 29/46; H01L 29/62; H01L 29/64
[52] U.S. Cl. .................................. 357/67; 357/65; 357/71; 357/74; 357/73
[58] Field of Search ............ 357/65, 68, 71, 74, 357/67, 73

[56] References Cited

U.S. PATENT DOCUMENTS

| | | | |
|---|---|---|---|
| 3,409,974 | 11/1968 | Lueck et al. | 357/67 |
| 3,458,778 | 7/1969 | Genzabella | 357/67 |
| 3,508,124 | 4/1970 | Boule et al. | 357/71 |
| 3,520,720 | 7/1970 | Saia et al. | 357/74 |
| 3,544,859 | 12/1970 | Tijburg | 357/74 |
| 3,597,665 | 8/1971 | Quetsch | 357/67 |
| 3,716,907 | 2/1973 | Anderson | 357/68 |
| 3,893,229 | 7/1975 | Aird | 357/68 |
| 3,909,929 | 10/1975 | Debesis | 357/68 |

*Primary Examiner*—Andrew J. James
*Attorney, Agent, or Firm*—Harold Levine; James T. Comfort; Gary C. Honeycutt

[57] ABSTRACT

A coaxial-lead, double-plug, glass-sealed semiconductor diode is provided with gold-germanium alloy contacts metallurgically bonded to Dumet alloy plugs.

11 Claims, 2 Drawing Figures

GOLD-GERMANIUM ALLOY CONTACTS FOR A SEMICONDUCTOR DEVICE

SUMMARY OF THE INVENTION

This invention relates to semiconductor devices, and more particularly to the assembly or packaging of a semiconductor diode in a coaxial double-plug, glass-sealed package, wherein both the anode and cathode of the diode are bonded to the coaxial leads by means of a gold-germanium alloy.

BACKGROUND OF THE INVENTION

A coaxial-lead, glass-sealed semiconductor diode, commonly referred to as a "glass diode," has been a standard device for many years. Typically, such devices have not required a metallurgical bond between the metal contacts of the semiconductor chip and the surfaces of the metal plug leads in contact therewith, since the stresses generated when forming the glass-to-metal seal have been considered sufficient to provide reliable electrical continuity under the conditions encountered during normal use.

In certain environments, however, reliability problems have developed due to intermittent electrical discontinuities, i.e., intermittent separation of the chip contacts from the metallic plug leads. In order to solve this problem, various attempts to obtain reliable alloy bondings have been made. For example, diffusion bonding between the plugs and the semiconductor metallization has been tried and proven insufficient. Also, prior attempts have frequently resulted in excessive interaction of the device metallization with the silicon chip, thereby altering the device performance characteristics, and even leading to excessive stress concentrations resulting in a fracture of the silicon chip.

Accordingly, it is an object of the present invention to provide a glass diode assembly having improved reliability. A more specific object of the invention is to provide a glass diode assembly wherein improved metallurgical bonding is obtained to eliminate intermittent electrical discontinuities.

One aspect of the invention is embodied in a semiconductor device comprising a semiconductor body or chip having at least two ohmic contacts, each of said contacts comprising two layers, including a conductor layer in ohmic contact with the semiconductor and an outermost layer of gold-germanium alloy. The semiconductor chip is preferably a silicon p-n junction diode having a planar-diffused anode region with a raised ohmic contact thereto consisting of a siler bump coated with gold-germanium alloy.

In the preferred embodiment the cathode metallization consists of a nickel silicide layer in contact with the silicon, a nickel film in contact with the silicide, a silver layer on the nickel film and a layer of gold-germanium alloy on the silver. The nickel silicide and nickel films are optional, since satisfactory results can be obtained from a cathode metallization consisting of silver in contact with the silicon and an outer layer of gold-germanium alloy.

The gold-germanium alloy layer of both the anode and cathode metallizations is preferably a eutectic composition; although satisfactory results are obtained over a wide range of gold-germanium ratios, for example, the germanium content may lie within the range of 50 to 95% by weight of the remainder preferable consisting of gold. However, ternary alloys are also included within the scope of the invention.

Another aspect of the invention is embodied in a packaged semiconductor device comprising a coaxial-lead, double-plug, glass-sealed assembly having the above-described alloy-bonded semiconductor chip between the ends of nickel-alloy plugs. Although Dumet plugs are preferred, it is contemplated that other low-expansion alloy plugs are useful.

Although gold-germanium alloys are well-known in the soldering of silicon chips to Kovar headers, substantially different considerations apply in the context of a double-plug glass package. Specifically, the bond of the present invention must be made under circumstances which do not allow "scrubbing," as is typically required in the mounting of chips on headers. Moreover, the Dumet plugs employed in a standard glass package do not have uniform tip compositions; that is, the Dumet wire consists of a nickel-iron alloy core (42% Ni) within a copper sheath. Upon cutting of the Dumet wire, the copper sheath is partially "swiped" across the surface of the exposed tip. Therefore, in the assembly and bonding of a chip to Dumet plugs, bonding may occur either to a copper surface or to a copper-free, nickel-iron alloy surface, or to a combination of the two, and must be reliable regardless of which surface may be involved.

Figure 1:
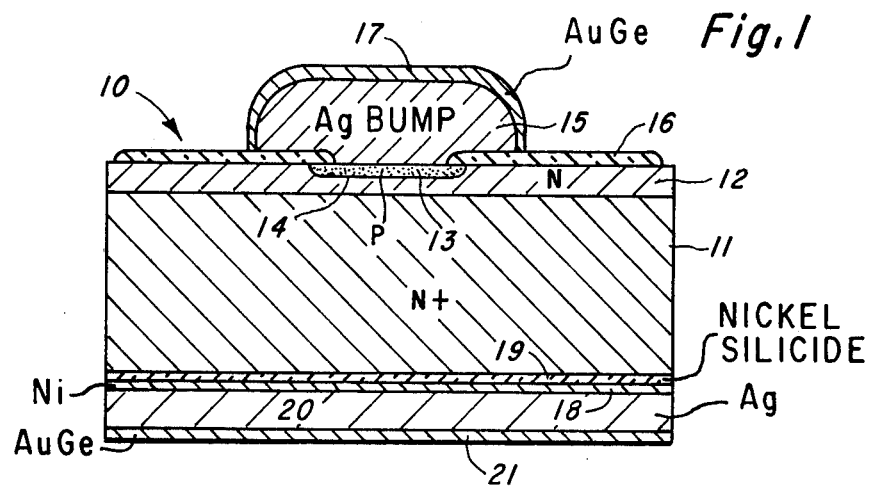
FIG. 1 is an enlarged cross-sectional view of the preferred semiconductor diode chip of the invention.

The semiconductor diode of FIG. 1 includes a heavy doped monocrystalline silicon substrate 11 having a resistivity of less than 0.1 ohm-centimeter, on which is grown an epitaxial silicon film 12 having a resistivity of at least 0.3 ohm-centimeter and preferably 0.5 to 3.0 ohm-centimeters wherein a planar-diffused region 13 is formed to provide a p-n junction 14 using well-known processes. Silver bump 15 is then provided as an ohmic contact to region 13 using known methods. For example, a thin trimetal film of titanium-palladium-silver is sequentially deposited by evaporation during a single vacuum pump-down cycle. The trimetal film is then patterned by known photolithographic techniques to fill only the silicon window defined by oxide layer 16. The silver bump is then completed by electroplating to a silver thickness of 1-4 mils. As well known to those skilled in the art, the electroplating process inherently spreads the deposited bump over a portion of the oxide surface, even though the current flow is limited to the oxide window.

An evaporated film of gold-germanium alloy is then deposited and patterned by photolithographic techniques to cover only the area of the silver bump. The gold-germanium film is deposited to a thickness of 10-50 microinches and preferably 20-30 microinches.

Next, the substrate is thinned from the backside to provide a total wafer thickness of about 5-10 mils, and preferably about 6 mils thick. Then nickel layer 18 is deposited to a thickness of about 3-15 microinches by any of the known electroless techniques. Nickel silicide layer 19 is formed by interaction of the nickel film with the substrate being a subsequent sintering step. Silver layer 20 is then deposited by evaporation to a thickness of 30-70 microinches followed by evaporative deposition of gold-germanium film 21 to a thickness of 10-50 microinches, and preferably 20-30 microinches. Finally, the wafer is subjected to a heat treatment at 350°-700°, preferably about 400° C for at least 5 minutes whereby the metallization layers are stablized, including particularly the interaction of nickel film 18 with silicon to form nickel silicide film 19.

The wafer is then scribed and diced to produce individual chips as illustrated in FIG. 1.

Figure 2:
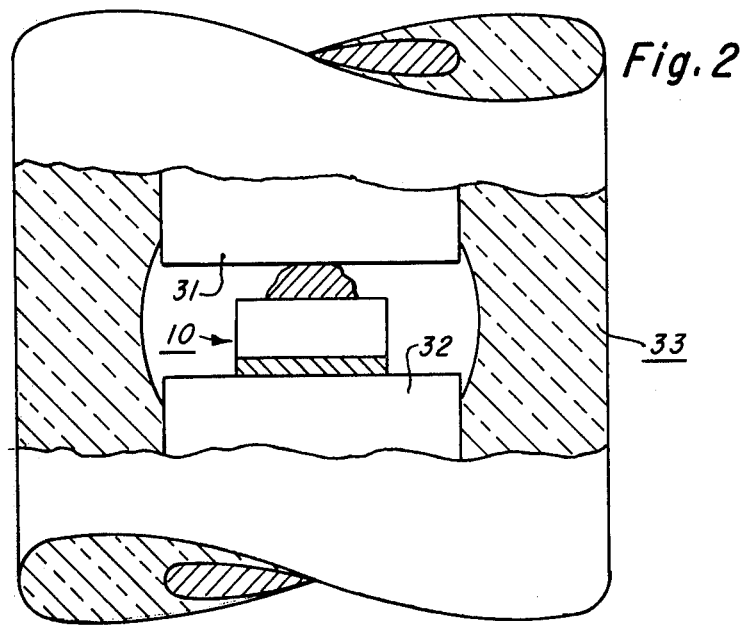
FIG. 2 is an enlarged cross-sectional view of the assembled, alloy-bonded, diode package of the invention including the semiconductor chip of FIG. 1.

The assembled package of FIG. 2 includes diode chip 10, the anode contact of which is bonded to Dumet plug 31 by the metallurgical interaction of gold-germanium film 17 with the nickel-iron alloy of the plug core, or the copper surface, if any, remaining thereon; while the cathode of diode 10 is bonded to Dumet plug 32 by metallurgical interaction of gold-germanium film 21 with the nickel-iron surface of plug 32 or the copper film, if any, remaining thereon. Plugs 31 and 32 are sealed within tubular glass sheath 33 by known techniques. For example, the assembly is placed in a furnace at a temperature of 650°-700° C, during which step glass member 33 softens to form a glass-to-metal seal with the Dumet plugs. At the same time, gold-germanium films 17 and 21 soften to form metallurgical bonds with plugs 31 and 32, respectively.

Reliability test have established that the assembly of FIG. 2 exhibits substantially zero failure incidence under conditions which have produced intermittent electrical discontinuities in the standard device.

What is claimed is:

1. A packaged semiconductor device comprising a semiconductor body having at least one ohmic contact on each of opposite sides thereof, sandwiched between the ends of two coaxial nickel-alloy plugs surrouned by a glass envelope sealed to said plugs, an alloy bond of one plug with one contact, and an alloy bond of the other plug with the other contact; each of said alloy bonds comprising a gold-germanium alloy.

2. A device as in claim 1 wherein said semiconductor body includes an anode region having one of said contacts thereon, a cathode region having the other of said contacts thereon, and the first ohmic contact of said anode comprises silver.

3. A device as in claim 1 wherein said cathode contact comprises nickel silicide.

4. A device as in claim 1 wherein said cathode contact includes a layer of nickel in contact with said silicide, and a layer of silver in contact with said gold-germanium alloy.

5. A semiconductor device comprising a coaxial-lead, double-plug, glass-sealed package having an alloy-bonded semiconductor chip therein, sandwiched between the plug ends, said chip having an anode region and a cathode region, each of said regions having an ohmic contact comprising at least two layers, including a conductor layer in contact with the semiconductor, and an outer layer bonded to one of said plug ends, said outer layer comprising a gold-germanium alloy, said plug ends comprising a nickel alloy.

6. A device as in claim 5 wherein the conductor layer of said anode contact comprises silver.

7. A device as in claim 5 wherein the conductor layer of said cathode contact comprises nickel silicide.

8. A device as in claim 7 wherein said cathode contact includes a layer of nickel in contact with said silicide, and a layer of silver in contact with said gold-germanium alloy.

9. A device as in claim 6 wherein the conductor layer of said cathode contact comprises nickel silicide.

10. A device as in claim 5 wherein said nickel alloy consists of nickel and iron.

11. A device as in claim 10 wherein said plugs include a copper sheath surrounding the nickel alloy.

* * * * *